US012620425B2

(12) United States Patent
Cha et al.

(10) Patent No.: US 12,620,425 B2
(45) Date of Patent: May 5, 2026

(54) MEMORY DEVICE AND METHOD OF OPERATING THE SAME

(71) Applicant: SAMSUNG ELECTRONICS CO., LTD., Suwon-si (KR)

(72) Inventors: Sanghoon Cha, Suwon-si (KR); Yuhwan Ro, Suwon-si (KR); Seungwoo Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 196 days.

(21) Appl. No.: 18/499,551

(22) Filed: Nov. 1, 2023

(65) Prior Publication Data

US 2024/0257851 A1      Aug. 1, 2024

(30) Foreign Application Priority Data

Jan. 27, 2023   (KR) ........................ 10-2023-0010611
May 26, 2023   (KR) ........................ 10-2023-0068327

(51) Int. Cl.
*G11C 8/06*          (2006.01)
*G11C 7/10*          (2006.01)
*G11C 8/04*          (2006.01)

(52) U.S. Cl.
CPC ............. *G11C 8/06* (2013.01); *G11C 7/1063* (2013.01); *G11C 8/04* (2013.01)

(58) Field of Classification Search
CPC ............ G11C 8/06; G11C 7/1063; G11C 8/04
See application file for complete search history.

(56) References Cited

U.S. PATENT DOCUMENTS 7,562,198 B2 *   7/2009  Noda ................... G11C 7/1006
                                                                     711/154
8,614,926 B2 *  12/2013  Hsieh ................... G11C 29/846
                                                                     365/189.08

(Continued)

FOREIGN PATENT DOCUMENTS

KR     10-2019-0101558  A     9/2019
KR     10-2021-0085284  A     7/2021

(Continued)

OTHER PUBLICATIONS

Extended European search report issued on Jun. 6, 2024, in counterpart European Patent Application No. 24152862.9 (14 pages).

(Continued)

*Primary Examiner* — Vanthu T Nguyen
(74) *Attorney, Agent, or Firm* — NSIP Law

(57)                  ABSTRACT

A memory device includes: a memory bank module comprising a memory bank; and an operation module comprising a processing in memory (PIM) block, wherein the memory bank comprises: an array of memory cells arranged in a plurality of rows and a plurality of columns; a row buffer configured to store data of a row corresponding to a row address among the plurality of rows; and a selecting module configured to select first data and second data corresponding to a column address from among the data stored in the row buffer, wherein the first data is transmitted to the PIM block through a first data path connected between the selecting module and the PIM block, and the second data is transmitted to the PIM block through a second data path connected between the selecting module and the PIM block.

30 Claims, 10 Drawing Sheets

(56)                     References Cited

U.S. PATENT DOCUMENTS

| | | |
|---|---|---|
| 10,838,899 B2 | 11/2020 | Lea |
| 2021/0382692 A1 | 12/2021 | Lee |
| 2022/0107803 A1 | 4/2022 | Ro et al. |
| 2022/0157371 A1 | 5/2022 | Kim et al. |
| 2022/0171620 A1 | 6/2022 | Malladi et al. |

FOREIGN PATENT DOCUMENTS

| | | |
|---|---|---|
| KR | 10-2021-0103373 A | 8/2021 |
| KR | 10-2022-0045480 A | 4/2022 |

OTHER PUBLICATIONS

Imani, Mohsen, et al., "FloatPIM: In-Memory Acceleration of Deep Neural Network Training with High Precision", Proceedings of the 46th International Symposium on Computer Architecture, Jun. 22-26, 2019, (14 Pages in English).

European Office Action Issued on Jun. 3, 2025, in Counterpart European Patent Application No. 24152862.9 (8 Pages in English).

Lee, Sukhan, et al., "Hardware Architecture and Software Stack for PIM Based on Commercial DRAM Technology: Industrial Product," ACM/IEEE 48th Annual International Symposium on Computer Architecture (ISCA), 2021, (14 Pages in English).

* cited by examiner

MEMORY DEVICE AND METHOD OF OPERATING THE SAME

CROSS-REFERENCE TO RELATED APPLICATIONS

This application claims the benefit under 35 USC § 119(a) of Korean Patent Application No. 10-2023-0010611, filed on Jan. 27, 2023, and Korean Patent Application No. 10-2023-0068327, filed on May 26, 2023, in the Korean Intellectual Property Office, the entire disclosures of which are incorporated herein by reference for all purposes.

BACKGROUND

1. Field

The following description relates to a memory device and a method of operating the same.

2. Description of Related Art

A convolutional neural network (CNN), a type of deep neural network (DNN), may be used in various application fields such as, for example, image and signal processing, object recognition, computer vision, and the like. The CNN may be configured to perform a multiply and accumulate (MAC) operation that repeats multiplication and addition using a considerably large number of matrices. When an application of a CNN is executed using general-purpose processors, a plurality of operations that implement a considerable amount of computation but are not complex (such as, for example, a plurality of MAC operations that calculate an inner product of two vectors and accumulates and sum the values) may be performed through processing in memory (PIM).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one or more general aspects, a memory device includes: a memory bank module comprising a memory bank; and an operation module comprising a processing in memory (PIM) block, wherein the memory bank comprises: an array of memory cells arranged in a plurality of rows and a plurality of columns; a row buffer configured to store data of a row corresponding to a row address among the plurality of rows; and a selecting module configured to select first data and second data corresponding to a column address from among the data stored in the row buffer,
  wherein the first data is transmitted to the PIM block through a first data path connected between the selecting module and the PIM block, and the second data is transmitted to the PIM block through a second data path connected between the selecting module and the PIM block.
The column address may include a first sub-column address and a second sub-column address, a first column group bit may be assigned to the first sub-column address, and a second column group bit may be assigned to the second sub-column address.

The selecting module may include: a first selector configured to select the first data based on the first sub-column address; and a second selector configured to select the second data based on the second sub-column address.
The first selector and the PIM block may be connected through the first data path, and the second selector and the PIM block may be connected through the second data path.
The PIM block may be configured to: receive the first data as a first operand from the first selector; receive the second data as a second operand from the second selector; and perform an operation between the first operand and the second operand.
The first operand and the second operand may be arranged as a pair in the data of the row corresponding to the row address.
The PIM block may be configured to receive the first operand and the second operand simultaneously.
The memory device may include a third multiplexer configured to: receive either one or both of the first column group bit and the second column group bit as a control signal; and output either one or both of the first data and the second data to an outside of the memory device.
The PIM block may include: a register; and a fourth multiplexer configured to select either one or both of data stored in the register and the first data output from the selecting module as a first operand.
The PIM block further may include: a fifth multiplexer configured to select any one of the data stored in either one or both of the register and the second data output from the selecting module as a second operand; and an operator configured to perform an operation between the first operand and the second operand.
The memory bank module may include a dynamic random-access memory (DRAM) bank.
The memory device may include: a sixth multiplexer configured to receive first data corresponding to the memory bank from the memory bank and transmit a first operand to the PIM block; and a seventh multiplexer configured to receive second data corresponding to the memory bank from the memory bank and transmit a second operand to the PIM block.
For the selecting of the first data and the second data, the selecting module may be configured to divide the column address into a first sub-column address and a second sub-column address, the first data may correspond to the first sub-column address and the second data may correspond to the second sub-column address.
A position of the first data in the first sub-column address may correspond to a position of the second data in the second sub-column address.
In one or more general aspects, an electronic device includes: the memory device; and a host processor, wherein, for the selecting of the first data and the second data, the selecting module may be configured to select the first data and the second data in response to the memory device of claim 1 receiving an instruction from the host processor.
In one or more general aspects, a method of operating a memory device includes: receiving a row address and a column address; storing data of a row corresponding to the row address in a row buffer of a memory bank of the memory device; selecting first data and second data corresponding to the column address from among the data stored in the row buffer; transmitting the first data to a processing in memory (PIM) block of the memory device through a first data path connected between the memory bank and the PIM block; and transmitting the second data to the PIM block through a second data path connected between the memory bank and the PIM block.

The column address may include a first sub-column address and a second sub-column address, a first column group bit may be assigned to the first sub-column address, and a second column group bit may be assigned to the second sub-column address.

The selecting may include: selecting the first data based on the first sub-column address; and selecting the second data based on the second sub-column address.

The method may include: receiving, by the PIM block, the first data as a first operand; receiving, by the PIM block, the second data as a second operand; and performing, by the PIM block, an operation between the first operand and the second operand.

The first operand and the second operand may be arranged as a pair in the data of the row corresponding to the row address.

The PIM block may be configured to receive the first operand and the second operand simultaneously.

The method may include: receiving either one or both of the first column group bit and the second column group bit as a control signal; and outputting either one or both of the first data and the second data to an outside of the memory device.

The memory bank may include a dynamic random-access memory (DRAM) bank.

In one or more general aspects, a non-transitory computer-readable storage medium stores instructions that, when executed by a processor, configure the processor to perform any one, any combination, or all of operations and/or methods described herein.

In one or more general aspects, a memory device includes: an operator comprising a logic circuit configured to perform a data operation; memory cells arranged in a plurality of rows and a plurality of columns; a row buffer configured to store row data of the memory cells; a first path connecting the row buffer and the operator; a second path connecting the row buffer and the operator and being independent of the first path; and a selecting module configured to select first data stored in the row buffer and transmit the first data through the first path, and select second data stored in the row buffer and different from the first data and transmit the second data through the second path.

The memory device may include: a first multiplexer connected to the first path; a second multiplexer connected to the second path; and a register connected to the first multiplexer and the second multiplexer.

The register may be connected to the first path and is not connected to the second path.

The memory device may include a multiplexer connected to the first path and the second path and configured to output either one or both of the first data and the second data to the outside of the memory device.

The selecting module may include: a first column decoder configured to select the first data; and a second column decoder configured to select the second data.

In one or more general aspects, a memory device includes: a memory bank comprising: an array of memory cells arranged in a plurality of rows and a plurality of columns; a row buffer configured to store data of a row corresponding to a row address among the plurality of rows; and a selecting module configured to select first data and second data corresponding to a column address from among the data stored in the row buffer, wherein the first data is transmitted to a processing in memory (PIM) block through a first data path connected between the selecting module and the PIM block, and the second data is transmitted to the PIM block through a second data path connected between the selecting module and the PIM block.

Other features and aspects will be apparent from the following detailed description, the drawings, and the claims.

Figure 1:
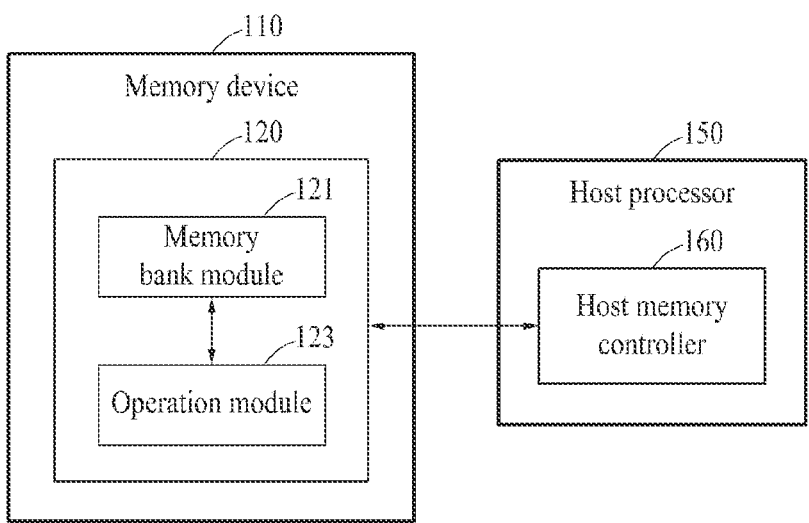
FIG. 1 illustrates an example of a memory device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

Although terms, such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Throughout the specification, when a component or element is described as being "connected to," "coupled to," or "joined to" another component or element, it may be directly (e.g., in contact with the other component or element) "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning. The use of the term "may" herein with respect to an example or embodiment, e.g., as to what an example or embodiment may include or implement, means that at least one example or embodiment exists where such a feature is included or implemented, while all examples are not limited thereto.

Unless otherwise defined, all terms used herein including technical or scientific terms have the same meaning as commonly understood by one of ordinary skill in the art to which the present disclosure pertains and based on an understanding of the disclosure of the present application. It will be further understood that terms, such as those defined in commonly-used dictionaries, should be interpreted as having a meaning that is consistent with their meaning in the context of the relevant art and the present disclosure, and will not be interpreted in an idealized or overly formal sense unless expressly so defined herein.

The examples may be implemented as various types of products, such as, for example, a personal computer (PC), a laptop computer, a tablet computer, a smartphone, a television (TV), a smart home appliance, an intelligent vehicle, a kiosk, and/or a wearable device. Hereinafter, examples will be described in detail with reference to the accompanying drawings. In the drawings, like reference numerals are used for like elements.

FIG. 1 illustrates an example of a memory device.

Referring to FIG. 1, as shown in FIG. 1, an example of the present disclosure may provide a processing in memory (PIM) memory system of an electronic device 100. The memory system may support additional computing resources to be integrated into a memory device 110. The electronic device 100 may include a memory device 110 connected to a host processor 150 (e.g., one or more processors) such as a graphics processing unit (GPU) or a central processing unit (CPU). The memory device 110 may accelerate an elementwise operation between vectors, and may be applied to artificial intelligence (AI) and high-performance computing (HPC) applications using the same. The electronic device 100 may be, include, or be applied to servers and mobile devices. For example, the electronic device 100 may be or include a personal computer (PC), a laptop computer, a tablet computer, a smartphone, a television (TV), a smart home appliance, an intelligent vehicle, a kiosk, and/or a wearable device.

In an example, the memory device 110 may include a memory die 120. The host processor 150 may include a host memory controller 160 (or a host controller) for interfacing with the memory device 110. However, the present disclosure is not limited thereto. For example, the host memory controller 160 may be separated from the host processor 150 (e.g., as a die separate from or the same as the host processor 150). Alternatively or additionally, the memory device 110 may include a memory controller, and the memory die 120 may be connected to the memory controller through an internal memory bus.

The host memory controller 160 may be configured to control the execution of instructions from the host processor 150. The instructions may include both regular instructions and PIM instructions. For example, the regular instructions (e.g., traditional loading (reading) and storing (writing) functions other than functional instructions in memory) may be transmitted by the host memory controller 160 and executed in a general manner. For example, the regular instructions may include an instruction for storing data received through an external bus in the memory die 120 and an instruction for retrieving data from the memory die 120 and transmitting the data to the host processor 150 through an external bus.

In some examples, the regular instructions and the PIM instructions may include an operation of storing data in a predetermined location in the memory die 120 (e.g., a predetermined page of a predetermined bank). The data may include two different operands, where each of the operands may include multiple values (e.g., floating point or integer values).

The aspects of the examples in the present disclosure relate to the use of in-memory computing (IMC), and the memory system may include a memory bank module 121 (e.g., a memory bank) and an operation module 123 (e.g., an operator) in the memory die 120. Some memory systems that are compared (e.g., a process near memory (PNM)) may include an operator (e.g., an arithmetic logic unit (ALU)) outside of a memory die, and the operator may be shared by memory banks of the memory die such that the operator may perform operations (e.g., arithmetic operations) on data stored in the memory die, without passing through an external bus.

Some aspects of the examples in the present disclosure relate to accelerating memory boundary operations by integrating the operation module 123 into the memory bank module 121 of the memory die 120. For example, the operation module 123 and the memory bank module 121 holding data may be in the same physical semiconductor die (e.g., the memory die 120). The operation module 123 may be associated with a PIM block such that computing may be performed on the data stored in the memory bank.

Before describing the structure of a memory system, some memory systems that are compared will be described with reference to FIG. 2A.

Figure 2A:
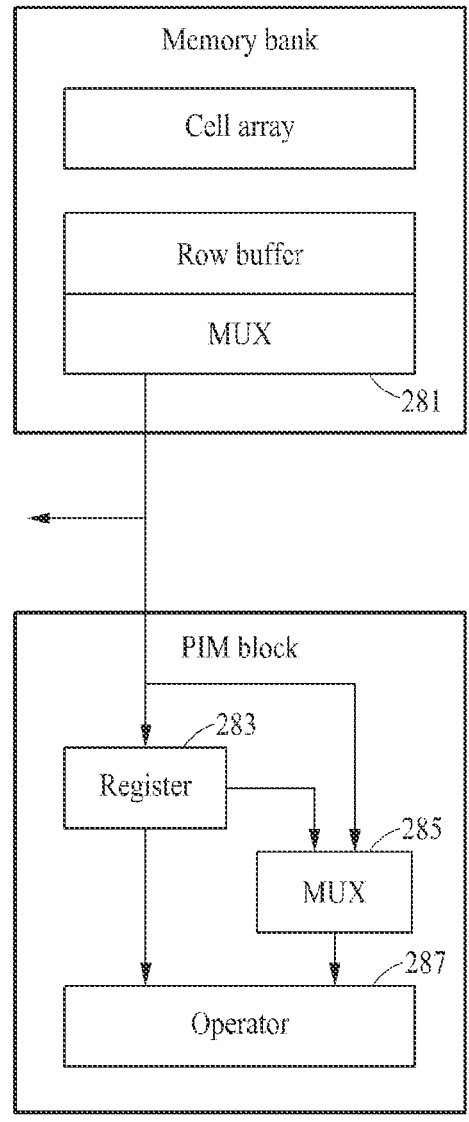
FIG. 2A illustrates an example of operations of some memory systems that are compared.

FIG. 2A illustrates an example of operations of some memory systems that are compared.

Referring to FIG. 2A, some memory systems that are compared may include a multiplexer (MUX) 281, a register 283, a MUX 285, and an operator 287. The MUX 281 may select a subset of columns from row data stored in a row buffer and supply the selected subset to the register 283, and the register 283 may be connected to a first operand input of the operator 287.

The memory systems of FIG. 2A may perform a first vector operation between two operands of the register 283 or a second vector operation between an operand of the register 283 and an operand of a memory bank.

An index of the register 283 may operate as pre-defined in an instruction register in a PIM block, but an address at which an operand is located in the memory bank may be input by a memory controller of a host. Therefore, only one operation block size (e.g., operand unit) may be moved from the memory bank to the PIM block.

For example, to perform the first vector operation, in a first phase (e.g., step or cycle), the register 283 may load the first operand, and in a second phase, the first operand and the second operand may be input as input of the operator 287. The second operand may be selected as input of the operator 287 through the MUX 285.

To perform the second vector operation, in the first phase, the register 283 may load the first operand, and in a second phase, the first operand and the second operand stored in the row buffer may be input as input of the operator 287. For example, the memory systems of FIG. 2A may perform a vector operation in two phases and thus, may use only half of the utilization of the operator.

Figure 2B:
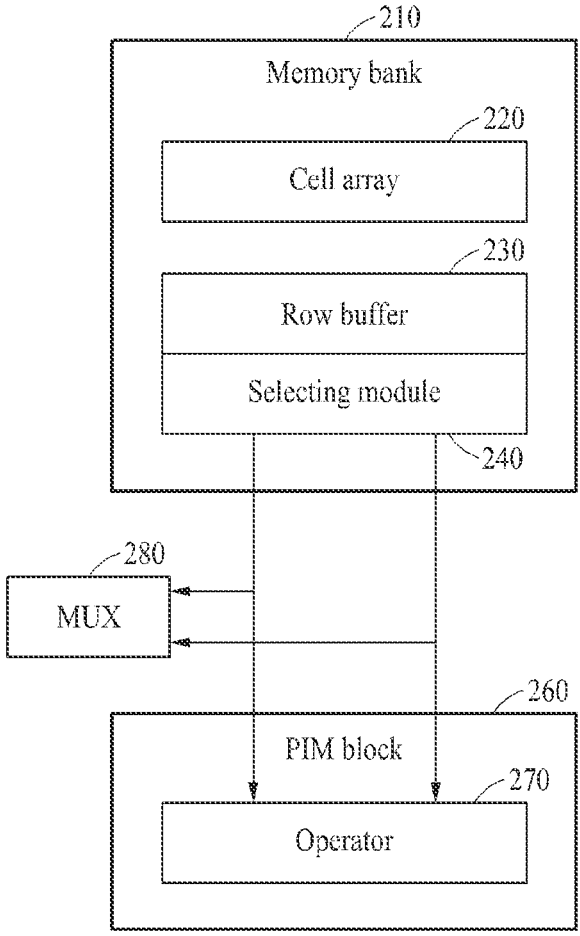
FIG. 2B illustrates an example of a memory bank connected to a processing in memory (PIM) block.

FIG. 2B illustrates an example of a memory bank connected to a PIM block. The description provided with reference to FIG. 1 may apply to the example of FIG. 2B, and thus, a repeated description may be omitted.

Referring to FIG. 2B, a memory bank 210 may include a cell array 220, a row buffer 230, and a selecting module 240 (e.g., a selector). The terms such as "-module," "-er(or)," etc., as used hereinafter may refer to a hardware component for processing at least one function or operation and may be hardware (e.g., hardware implementing instructions).

The memory bank 210 may include an array of memory cells (hereinafter, a cell array 220) arranged in rows and columns (or pages and columns). For example, the memory bank 210 may include DRAM cells arranged in n rows (or pages) and m columns. Here, n and m are natural numbers. A plurality of bitlines (e.g., B1 to Bm) may extend in a column direction of the array, and a plurality of row enable lines (e.g., R1 to Rn) may extend in a row direction of the array and traverse the bitlines. Each bitline may be connected to every cell in the corresponding column. For example, every cell in an i-th column of the array may be connected to a bitline Bi. Similarly, each of the row enable lines (e.g., R1 to Rn) may be connected to every memory cell in the corresponding row. For example, every cell in a j-th row or page of the array may be connected to a row enable line Rj. Memory cells in a row of the memory bank 210 may also be referred to as memory pages.

Figure 2C:
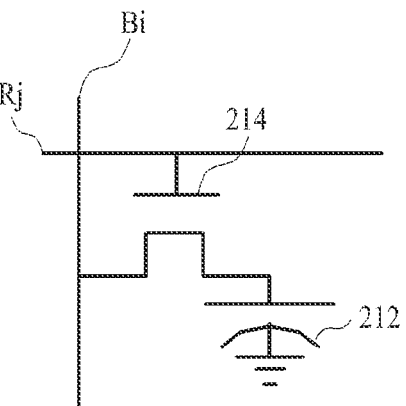
FIG. 2C illustrates an example of a dynamic random-access memory (DRAM) cell.

FIG. 2C illustrates an example of a dynamic random-access memory (DRAM) cell.

Referring to FIG. 2C, a DRAM cell may be generally modeled to include a capacitor 212 for storing a data voltage (e.g., a bit value, wherein the capacitor may store a voltage representing 0 bits or a voltage representing 1 bit) and a switch 214 for transmitting a data voltage to the capacitor 212. The predetermined DRAM cell shown in FIG. 2C may be in an i-th column and j-th row of an array. Accordingly, the switch 214 of the DRAM cell shown in FIG. 2C may be connected between an i-th bitline Bi and one terminal of the capacitor 212, and the other terminal of the capacitor 212 may be connected to the ground. As shown in FIG. 2C, a gate electrode of the switch 214 of the DRAM cell may be connected to a j-th row enable line Rj, such that when the switch 214 is turned on, the capacitor 212 may be connected to the bitline Bi. However, a memory cell according to an example is not limited to the DRAM cell. Various types of memory cells may be employed according to design.

Referring back to FIG. 2B, the memory bank 210 may include a row decoder connected to the row enable lines (e.g., R1 to Rn). For example, the row decoder may be configured to supply a row enable signal to a predetermined one of the row enable lines corresponding to a row address supplied from the host memory controller 160. When writing data to or reading data from a predetermined row of a memory cell, the row decoder may supply a row enable signal to a row enable line corresponding to the predetermined row. When writing data, a voltage corresponding to the data to be written may be supplied to bitlines (e.g., B1 to Bm) while a predetermined row is enabled.

Similarly, when reading data from a predetermined row of the cell array 220, voltages corresponding to the voltages stored in the capacitor 212 may be transmitted along the bitlines (e.g., B1 to Bm) and read by the row buffer 230. The row buffer 230 may be connected to a corresponding one of the bitlines. In an example, the cell array 220 may include 8,192 corresponding bitlines (e.g., bitlines B1 to B8192) connected to 8,192 columns and 8,192 corresponding row buffers 230. For example, each page may store data of 8,192 bits or 8 Kibits. The row buffer 230 may store data read from a current row (or page) until the data is erased by a "precharge" instruction.

The selecting module 240 may include a plurality of selectors. A selector may be a device configured to select data corresponding to a column address from among data stored in the row buffer 230, and may be, for example, a multiplexer. However, the selector is not limited to a multiplexer, and the selector may include various devices configured to select predetermined data from among a plurality of data. Hereinafter, the selecting module 240 including a first multiplexer and a second multiplexer will be described for ease of description. Further, the selecting module 240 may also be referred to as a column decoder.

The selecting module 240 may be used to select a subset of data columns using the first multiplexer and the second multiplexer, and to perform computation on the data, the read data may be supplied to an in-memory computing (IMC) module through a global input/output (IO) layer.

As described in detail below, the selecting module 240 may be used to control data flow for a plurality of (e.g., two) inputs of an operator 270 (e.g., as a first operand and a second operand for the operator 270). The selecting module may select a plurality of data (e.g., first data and second data) corresponding to a column address from among the data stored in the row buffer 230. The operator 270 may perform an operation (e.g., a vector multiplication operation), and an operation result may be written back to the cell array 220 or transmitted to a host processor through an IO module. For example, the operator 270 may include a floating point unit (FPU), an ALU, an adder, and/or a multiplier.

The memory device of one or more embodiments may have operands that operate as a set (e.g., a pair) so as to receive only one bank address, without separately receiving a plurality of (e.g., two) bank addresses in the memory bank 210 multiple times (e.g., two times), compared to a typical memory device which may need to separately receive a plurality of bank addresses in a memory bank multiple times. In the memory device of one or more embodiments, multiple operands may be simultaneously input as input of the operator 270 using multiple data paths between the memory bank 210 and a PIM block 260 and calculated at once. Hereinafter, a structure of a column address for operands to operate as a set (e.g., a pair) will be described with reference to FIG. 3.

Figure 3:
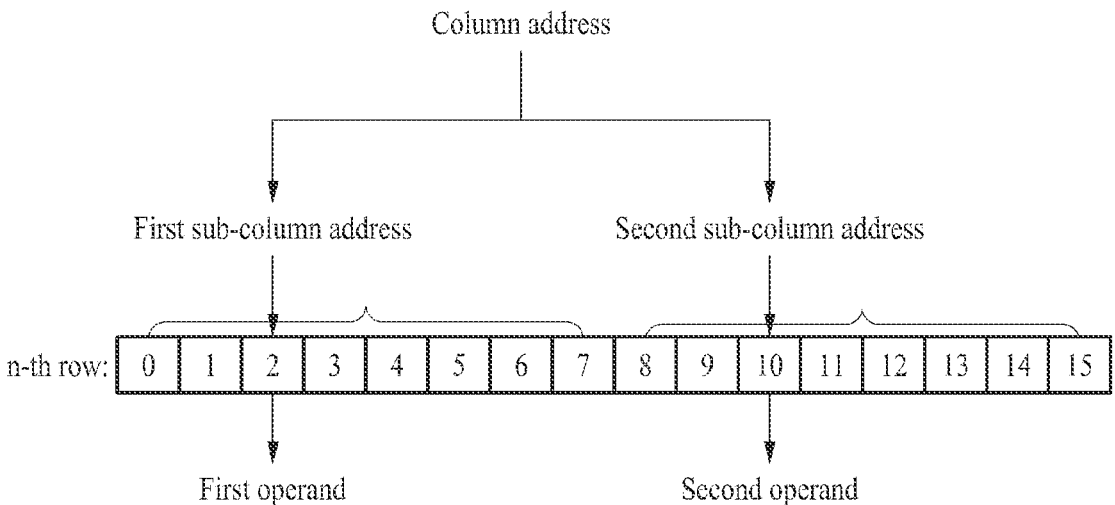
FIG. 3 illustrates an example of a structure of a column address for simultaneously inputting an operand pair into an operator.

FIG. 3 illustrates an example of a structure of a column address for simultaneously inputting an operand set into an operator.

In order to simultaneously use a plurality of (e.g., two) operands in a memory bank (e.g., the memory bank 210 of FIG. 2B), a plurality of (e.g., two) column addresses for operands to be used for a PIM operation may be received at once by a memory controller. Hereinafter, a memory device of one or more embodiments configured to process two operands simultaneously will be described for ease of description.

In the case of performing a vector operation between a first operand of the memory bank and a second operand of the memory bank, when the memory controller receives an incoming row address and a column address in the row address separately, then it may be difficult for a typical memory device to achieve acceleration performance since operand addresses are received two times. To solve this technical problem, in the memory device of one or more embodiments, a column address may divide in advance a plurality of column data present in the same row into a plurality of (e.g., two) groups.

Referring to FIG. 3, the memory device may divide the column address supplied from the memory controller into a first sub-column address and a second sub-column address, and column data corresponding to each may be used as two operands of a PIM block operation. The first sub-column address and the second sub-column address may be referred to as Column Address 0 and Column Address 1, respectively.

A first column group bit may be assigned to the first sub-column address, and a second column group bit may be assigned to the second sub-column address. For example, "0" may be assigned as the first column group bit to the first sub-column address, and "1" may be assigned as the second column group bit to the second sub-column address.

For example, when the column address is divided into the first sub-column address and the second sub-column address, the first column group bit may be added to a predetermined location (e.g., a most significant bit) of the first sub-column address, and the second column group bit may be added to a predetermined location (e.g., a most significant bit) of the second sub-column address.

For example, when the size of an n-th row is 4,056 bits and the size of a column is 256 bits, sixteen columns may be present in one row. Columns No. 0 to No. 7 may be used as input of a first data path, and columns No. 8 to No. 15 may be used as input of a second data path.

When the column address is divided into the first sub-column address and the second sub-column address, the first sub-column address may be input as input of a first multiplexer of the selecting module, and the second sub-column address may be input as input of a second multiplexer of the selecting module. A position of the first data in the first sub-column address may correspond to a position of the second data in the second sub-column address, For example, first data corresponding to the first sub-column address (e.g., column data No. 0) and second data corresponding to the second sub-column address (e.g., column data No. 8) may be paired and used as operands of a vector operation. Similarly, (1, 9), (2, 10), . . . , (7, 15) may be paired and used as operands of a vector operation. Here, in (a, b), "a" denotes column data No. a corresponding to the first sub-column address, and "b" denotes column data No. b corresponding to the second sub-column address. As described above, to use a column data pair included in the same row as operands, the memory device of one or more embodiments may arrange two operands to be used for an operation in one row, and thereby increase a row buffer hit ratio, and thereby reduce time for repeated PRE-ACT and achieve further performance improvement.

Although the memory device configured to process two operands simultaneously is described with reference to FIG. 3 for ease of description, examples are not limited thereto, and the memory device may process a plurality of (e.g., two) operands simultaneously.

To this end, the column address supplied from the memory controller may be divided into a first sub-column address to an n-th sub-column address (n being a natural number greater than or equal to "2"), and a plurality of column data corresponding to the respective sub-column addresses may be used as n operands of a PIM block operation. The first sub-column address to the n-th sub-column address may be referred to as Column Address 0 to Column Address n, respectively.

When the column address is divided into the first sub-column address to the n-th sub-column address, the first sub-column address may be input as input of a first multi-plexer of the selecting module, and the n-th sub-column address may be input as input of an n-th multiplexer of the selecting module. First data corresponding to the first sub-column address to n-th data corresponding to the n-th sub-column address may be used as operands of a vector operation as one set.

Figure 4A:
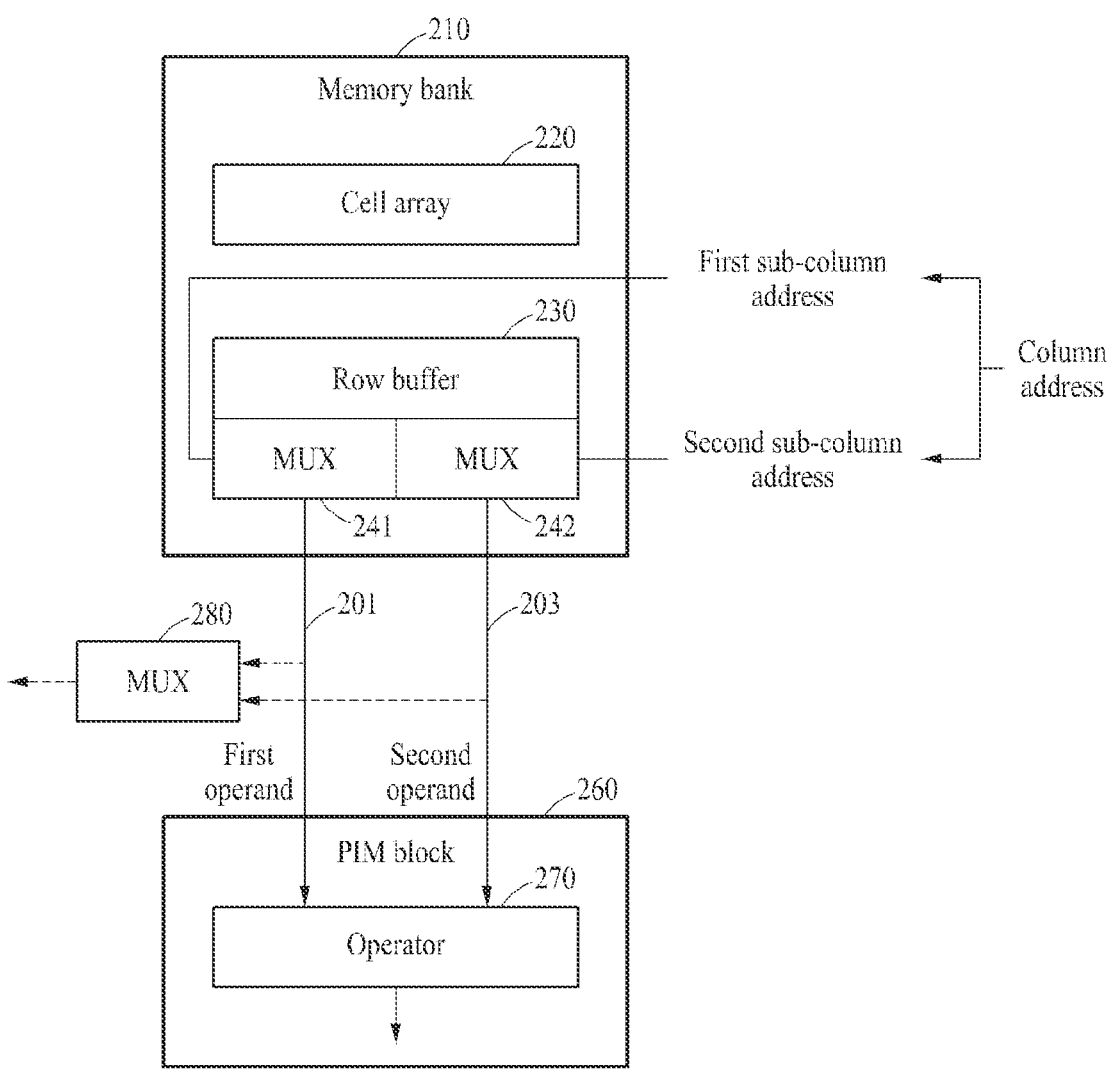
FIG. 4A illustrates an example of an operation when a memory device receives a PIM instruction.

FIG. 4A illustrates an example of an operation when a memory device receives a PIM instruction.

Referring to FIG. 4A, a memory device (e.g., the memory device 110 of FIG. 1) may receive a PIM instruction from a host processor (e.g., the host processor 150 of FIG. 1) and control the execution of the instruction.

The memory device may receive a column address and assign a first sub-column address and a second sub-column address to a first multiplexer 241 and a second multiplexer 242, respectively.

The first multiplexer 241 may select first data correspond-ing to the first sub-column address from among row data in the row buffer 230, and the second multiplexer 242 may select second data corresponding to the second sub-column address from among the row data in the row buffer 230. Hereinafter, the first multiplexer 241 may also be referred to as a first selector, and the second multiplexer 242 may also be referred to as a second selector. Further, hereinafter, the first multiplexer 241 may also be referred to as a first column decoder, and the second multiplexer 242 may also be referred to as a second column decoder.

The first multiplexer 241 and the PIM block 260 may be connected through a first data path 201, and the second multiplexer 242 and the PIM block 260 may be connected through a second data path 203. For example, the first multiplexer 241 and the operator 270 of the PIM block 260 may be connected through the first data path 201 such that the first data may be transmitted as a first operand from the first multiplexer 241 to the operator 270, and the second multiplexer 242 and the operator 270 of the PIM block 260 may be connected through the second data path 203 such that the second data may be transmitted as a second operand from the second multiplexer 242 to the operator 270. In other words, the memory device of one or more embodiments may receive one column address and transmit a first operand and a second operand simultaneously and independently to the operator 270, thereby using the memory internal bandwidth twice compared to the memory device of FIG. 2C.

Figure 4B:
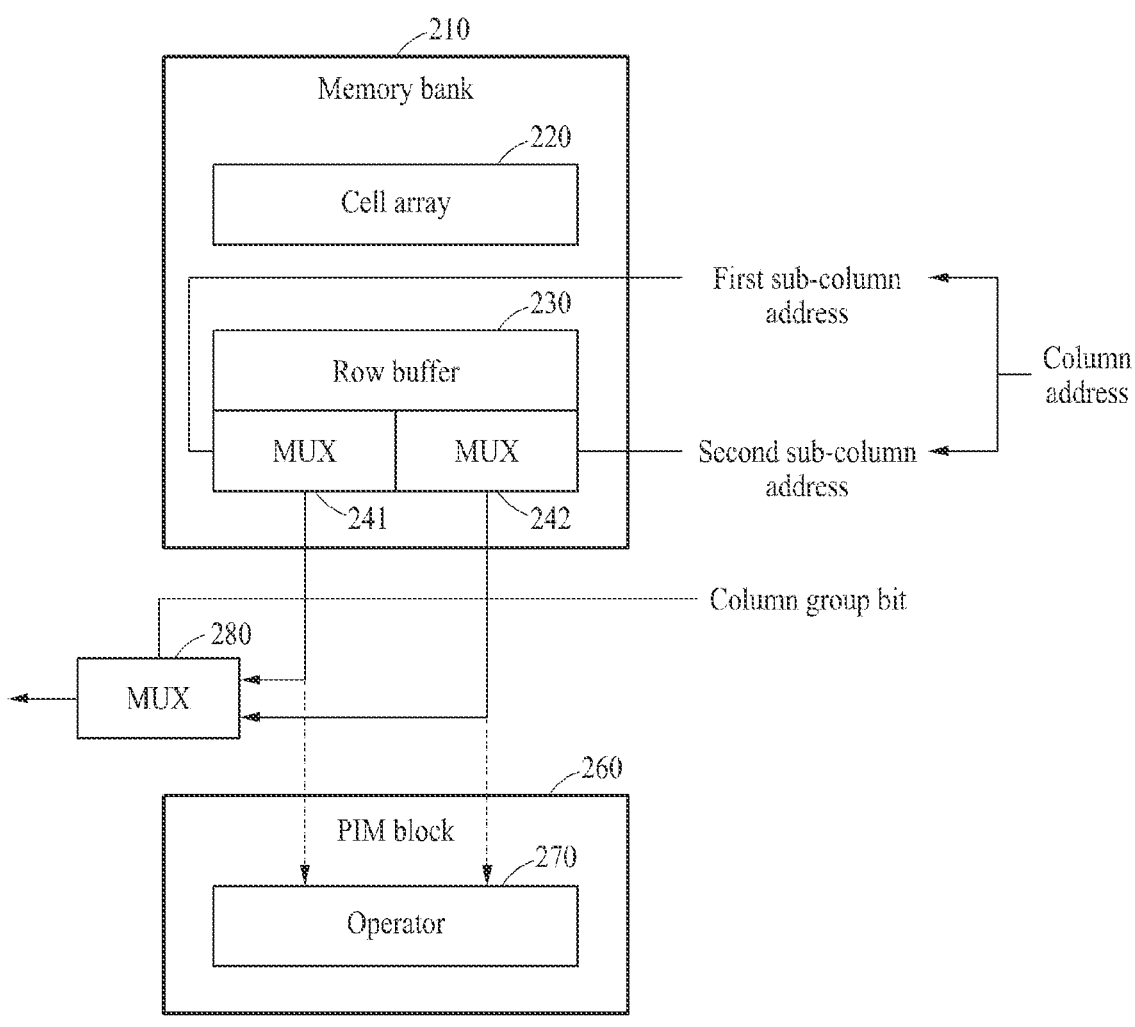
FIG. 4B illustrates an example of an operation when a memory device receives a regular instruction.

FIG. 4B illustrates an example of an operation when a memory device receives a regular instruction.

Referring to FIG. 4B, a memory device (e.g., the memory device 110 of FIG. 1) may receive a regular instruction from a host processor (e.g., the host processor 150 of FIG. 1) and control the execution of the instruction.

The memory device may receive a column address and assign a first sub-column address to the first multiplexer 241 and a second sub-column address to the second multiplexer 242. The first multiplexer 241 may select first data corresponding to the first sub-column address from among row data in the row buffer 230, and the second multiplexer 242 may select second data corresponding to the second sub-column address from among the row data in the row buffer 230.

The memory device may further include a third multiplexer 280 for data movement with an external channel. The third multiplexer 380 may receive a first column group bit or a second column group bit as a control signal and output first data or second data to an outside of the memory device. For example, the third multiplexer 280 may output the first data to the outside of the memory device when receiving the first column group bit as a control signal, and output the second data to the outside of the memory device when receiving the second column group bit as a control signal.

Figure 5A:
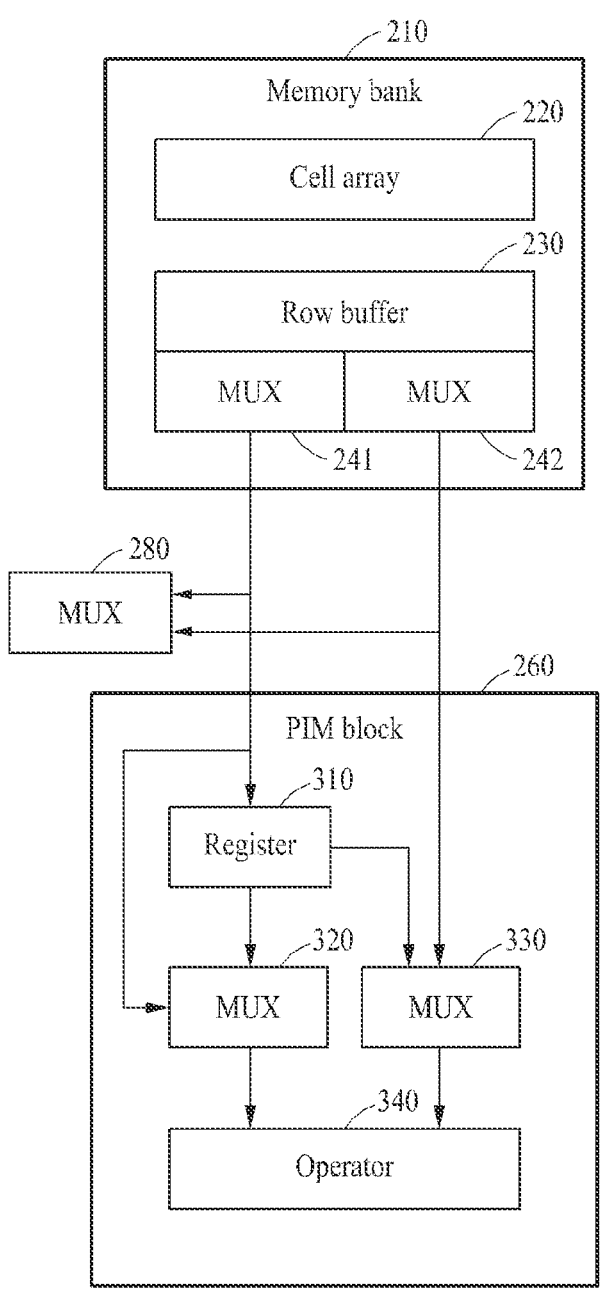
FIG. 5A illustrates an example of a memory device including a PIM block.

FIG. 5A illustrates an example of a memory device including a PIM block. The description provided with reference to FIGS. 4A and 4B may identically apply to the example of FIG. 5A, and thus, a repeated description will be omitted.

Referring to FIG. 5A, the PIM block 260 may include a register 310, a fourth multiplexer 320, a fifth multiplexer 330, and an operator 340.

As described above, a memory system may perform a vector operation between two operands of a memory bank. Furthermore, the memory system may perform an operation between a matrix and vectors. When the matrix and the vectors are different in size, the operation between the matrix and the vectors may not be performed at once. Accordingly, the PIM block 260 of one or more embodiments may perform the operation between the matrix and the vectors through a method that stores the vectors in the register 310 and transmits the vectors one by one from the register 310 to the operator 340.

The memory system may also perform a first operation between two operands of the register 310 (e.g., an operation between vectors) and a second operation between an operand of the register 310 and an operand of the memory bank (e.g., an operation between a matrix and vectors). For example, to perform the first vector operation, the operator 340 may receive a first operand and a second operand of the register 310 through the fourth multiplexer 320. To perform the second operation, the operator 340 may receive the first operand of the register 310 through the fourth multiplexer 320 and receive a second operand of a row buffer through the fifth multiplexer 330.

Figure 5B:
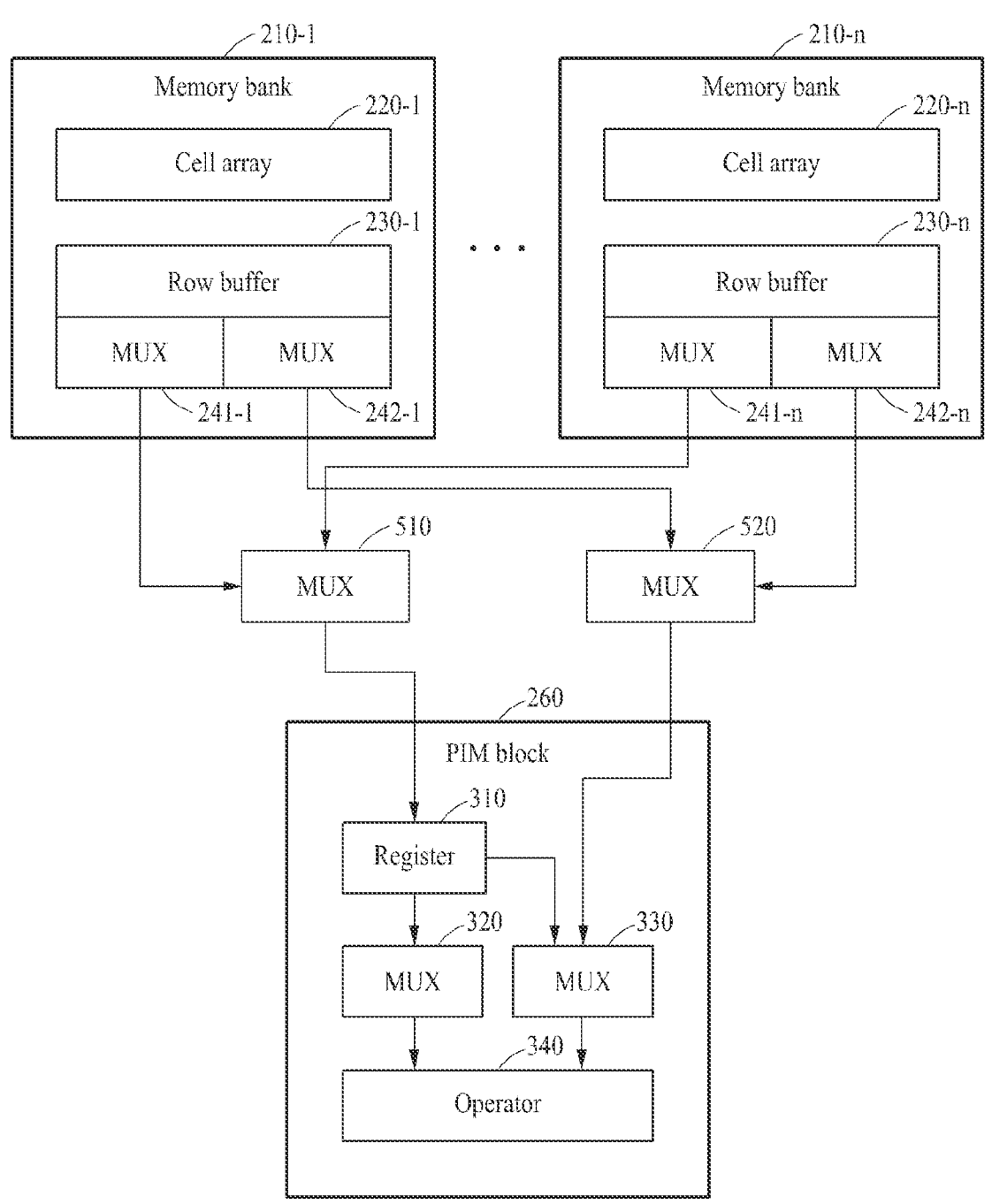
FIG. 5B illustrates an example of a memory device in which a plurality of memory banks are connected to a PIM block.

FIG. 5B illustrates an example of a memory device in which a plurality of memory banks are connected to a PIM block. The description provided with reference to FIGS. 4A and 4B may identically apply to the example of FIG. 5B, and thus, a repeated description will be omitted. For example, memory banks 210-1 through 210-n, cell arrays 220-1 through 220-n, row buffers 230-1 through 230-n, first multiplexers 241-1 through 241-n, and second multiplexers 242-1 through 210-n may respectfully correspond to the memory bank 210, the cell array 220, the row buffer 230, the first multiplexer 241, and the second multiplexer 242. Here, n is a natural number greater than 1.

Referring to FIG. 5B, a first multiplexer 241-1 and a second multiplexer 242-1 of a memory bank 210-1 may be connected to a sixth multiplexer 510 and a seventh multiplexer 520, respectively. Likewise, a first multiplexer 241-n and a second multiplexer 242-n of a memory bank 210-n may be connected to the sixth multiplexer 510 and the seventh multiplexer 520, respectively.

Through the connection of the plurality of memory banks 210-1 to 210-n to the PIM block 260, the memory device of one or more embodiments may increase the frequency of the PIM block 260, thereby advantageously accelerating an operation (e.g., an operation between vectors, an operation between a matrix and vectors, or an operation between matrices) processing speed.

Although the amount of data to be input may be increased according to the frequency of the PIM block 260, the frequency of a memory core may be difficult to increase, and thus, the memory device of one or more embodiments may increase the parallelism of inputs from the memory banks 210-1 to 210-n to the PIM block 260.

Figure 6:
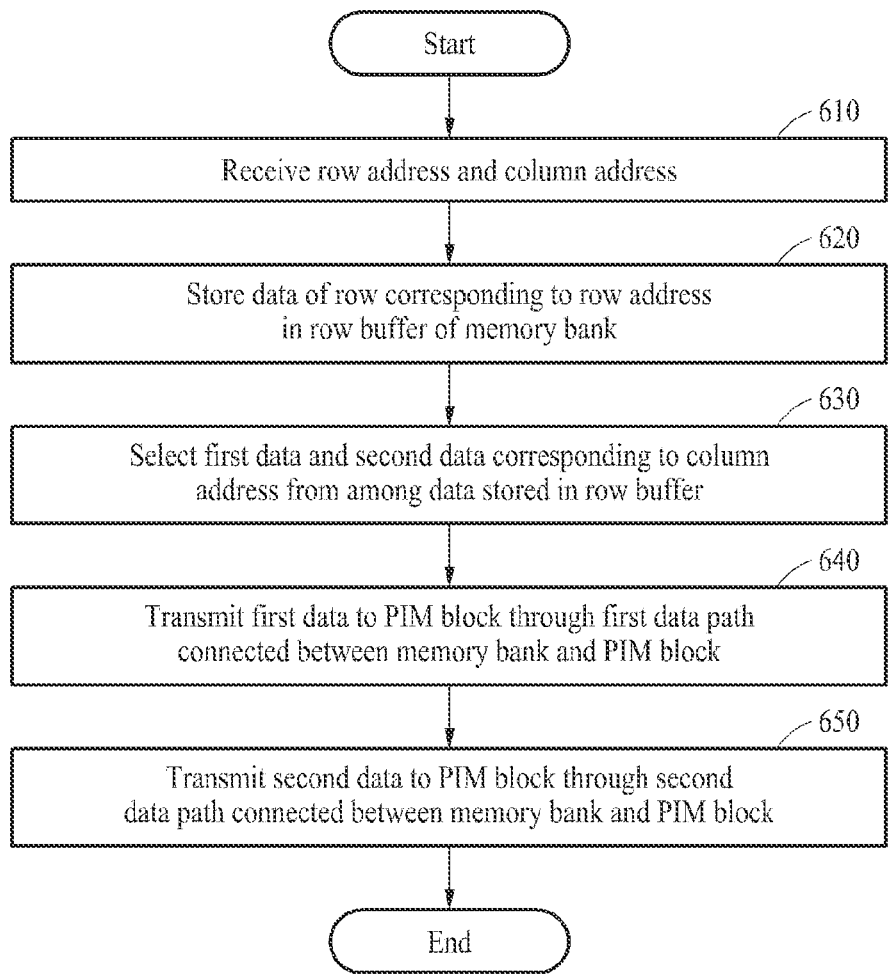
FIG. 6 illustrates an example of a method of operating a memory device.

FIG. 6 illustrates an example of a method of operating a memory device.

For ease of description, it will be described that operations 610 to 640 are performed using the memory device 110 shown in FIG. 1. However, operations 610 to 640 may be performed by another suitable electronic device in any suitable system.

Furthermore, the operations of FIG. 6 may be performed in the shown order and manner. However, the order of some operations may change, or some operations may be omitted, without departing from the spirit and scope of the shown example. The operations shown in FIG. 6 may be performed in parallel or simultaneously.

In operation 610, the memory device 110 may receive a row address and a column address. The column address may include a first sub-column address and a second sub-column address. A first column group bit may be assigned to the first sub-column address, and a second column group bit may be assigned to the second sub-column address.

In operation 620, the memory device 110 may store data of a row corresponding to the row address in a row buffer of a memory bank.

In operation 630, the memory device 110 may select first data and second data corresponding to the column address from among the data stored in the row buffer. The memory device 110 may select the first data based on the first sub-column address and select the second data based on the second sub-column address.

In operation 640, the memory device 110 may transmit the first data to a PIM block through a first data path connected between the memory bank and the PIM block.

In operation 650, the memory device 110 may transmit the second data to the PIM block through a second data path connected between the memory bank and the PIM block.

The memory device 110 may transmit the first data and the second data simultaneously to the PIM block. The PIM block may receive the first data as a first operand, receive the second data as a second operand, and perform an operation between the first operand and the second operand.

The memory device 110, memory die 120, memory bank module 121, operation module 123, host processor 150, host memory controller 160, MUX 281, register 283, MUX 285, operator 287, memory bank 210, cell array 220, row buffer 230, selecting module 240, PIM block 260, operator 270, third multiplexer 280, first multiplexer 241, second multiplexer 242, register 310, fourth multiplexer 320, fifth multiplexer 330, operator 340, memory bank 210-1, memory bank 210-1, cell array 220-1, row buffer 230-1, first multiplexer 241-1, second multiplexer 242-1, memory bank 210-n, cell array 220-n, row buffer 230-n, first multiplexer 241-n, second multiplexer 242-n, sixth multiplexer 510, seventh multiplexer 520, and other apparatuses, devices, units, modules, and components disclosed and described herein with respect to FIGS. 1-6 are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A memory device, comprising:
a memory bank module comprising a memory bank; and
an operation module comprising a processing in memory (PIM) block,
wherein the memory bank comprises:
an array of memory cells arranged in a plurality of rows and a plurality of columns;
a row buffer configured to store data of a row corresponding to a row address among the plurality of rows; and
a selecting module configured to select, from among the data stored in the row buffer, first data of a first sub-column address and second data of a second sub-column address corresponding to a column address received by the memory device,
wherein the first data is transmitted from a first selector of the selecting module to a selector of the PIM block through a first data path connected between the selecting module and the PIM block, and the second data is transmitted from a second selector of the selecting module to another selector of the PIM block through a second data path connected between the selecting module and the PIM block.

2. The memory device of claim 1, wherein
the column address comprises the first sub-column address and the second sub-column address,
a first column group bit is assigned to the first sub-column address, and
a second column group bit is assigned to the second sub-column address.

3. The memory device of claim 2, wherein the selecting module comprises:
the first selector configured to select the first data based on the first sub-column address; and
the second selector configured to select the second data based on the second sub-column address.

4. The memory device of claim 3, wherein
the first selector and the PIM block are connected through the first data path, and
the second selector and the PIM block are connected through the second data path.

5. The memory device of claim 3, wherein the PIM block is configured to:
receive the first data as a first operand from the first selector;
receive the second data as a second operand from the second selector; and
perform an operation between the first operand and the second operand.

6. The memory device of claim 5, wherein the first operand and the second operand are arranged as a pair in the data of the row corresponding to the row address.

7. The memory device of claim 5, wherein the PIM block is configured to receive the first operand and the second operand simultaneously.

8. The memory device of claim 2, further comprising a multiplexer configured to:
receive either one or both of the first column group bit and the second column group bit as a control signal; and
output either one or both of the first data and the second data to an outside of the memory device.

9. The memory device of claim 1, wherein the PIM block comprises:
a register; and
a multiplexer configured to select either one or both of data stored in the register and the first data output from the selecting module as a first operand.

10. The memory device of claim 9, wherein the PIM block further comprises:
another multiplexer configured to select any one of the data stored in either one or both of the register and the second data output from the selecting module as a second operand; and
an operator configured to perform an operation between the first operand and the second operand.

11. The memory device of claim 1, wherein the memory bank module comprises a dynamic random-access memory (DRAM) bank.

12. The memory device of claim 1, wherein:
the first selector comprises a multiplexer configured to receive first data corresponding to the memory bank from the memory bank and transmit a first operand to the PIM block; and
the second selector comprises another multiplexer configured to receive second data corresponding to the memory bank from the memory bank and transmit a second operand to the PIM block.

13. The memory device of claim 1, wherein,
for the selecting of the first data and the second data, the selecting module is configured to divide the column address into the first sub-column address and the second sub-column address,
the first data corresponds to the first sub-column address and the second data corresponds to the second sub-column address.

14. The memory device of claim 13, wherein a bit position of the first data in the first sub-column address corresponds to a bit position of the second data in the second sub-column address.

15. An electronic device comprising:

the memory device of claim 1; and a host processor, wherein, for the selecting of the first data and the second data, the selecting module is configured to select the first data and the second data in response to the memory device of claim 1 receiving an instruction from the host processor.

16. A method of operating a memory device, the method comprising:

receiving a row address and a column address;

storing data of a row corresponding to the row address in a row buffer of a memory bank of the memory device;

selecting, from among the data stored in the row buffer, first data of a first sub-column address and second data of a second sub-column address corresponding to the column address;

transmitting the first data from a first selector of the selecting module to a selector of a processing in memory (PIM) block of the memory device through a first data path connected between the memory bank and the PIM block; and transmitting the second data from a second selector of the selecting module to another selector of the PIM block through a second data path connected between the memory bank and the PIM block.

17. The method of claim 16, wherein the column address comprises the first sub-column address and the second sub-column address, a first column group bit is assigned to the first sub-column address, and a second column group bit is assigned to the second sub-column address.

18. The method of claim 17, wherein the selecting comprises:

selecting the first data based on the first sub-column address; and selecting the second data based on the second sub-column address.

19. The method of claim 18, further comprising:

receiving, by the PIM block, the first data as a first operand;

receiving, by the PIM block, the second data as a second operand; and performing, by the PIM block, an operation between the first operand and the second operand.

20. The method of claim 19, wherein the first operand and the second operand are arranged as a pair in the data of the row corresponding to the row address.

21. The method of claim 19, wherein the PIM block is configured to receive the first operand and the second operand simultaneously.

22. The method of claim 17, further comprising:

receiving either one or both of the first column group bit and the second column group bit as a control signal; and outputting either one or both of the first data and the second data to an outside of the memory device.

23. The method of claim 16, wherein the memory bank comprises a dynamic random-access memory (DRAM) bank.

24. A non-transitory computer-readable storage medium storing instructions that, when executed by a processor, configure the processor to perform the method of claim 13.

25. A memory device, comprising:

an operator comprising a logic circuit configured to perform a data operation;

memory cells arranged in a plurality of rows and a plurality of columns;

a row buffer configured to store row data of the memory cells;

a first path connecting the row buffer and the operator;

a second path connecting the row buffer and the operator and being independent of the first path; and a selecting module configured to select, from among the row data stored in the row buffer, first data of a first sub-column address and second data of a second sub-column address corresponding to a column address received by the memory device, and transmit the first data from a first selector of the selecting module to a selector of the operator through the first path and the second data from a second selector of the selecting module to another selector of the operator through the second path.

26. The memory device of claim 25, further comprising:

a first multiplexer connected to the first path;

a second multiplexer connected to the second path; and a register connected to the first multiplexer and the second multiplexer.

27. The memory device of claim 26, wherein the register is connected to the first path and is not connected to the second path.

28. The memory device of claim 25, further comprising a multiplexer connected to the first path and the second path and configured to output either one or both of the first data and the second data to the outside of the memory device.

29. The memory device of claim 25, wherein the selecting module comprises:

a first column decoder configured to select the first data; and a second column decoder configured to select the second data.

30. A memory device, comprising:

a memory bank comprising:

an array of memory cells arranged in a plurality of rows and a plurality of columns;

a row buffer configured to store data of a row corresponding to a row address among the plurality of rows; and a selecting module configured to select, from among the data stored in the row buffer, first data of a first sub-column address and second data of a second sub-column address corresponding to a column address received by the memory device, wherein the first data is transmitted from a first selector of the selecting module to a selector of a processing in memory (PIM) block through a first data path connected between the selecting module and the PIM block, and the second data is transmitted from a second selector of the selecting module to another selector of the PIM block through a second data path connected between the selecting module and the PIM block.

* * * * *